United States Patent
Wu et al.

(10) Patent No.: US 9,177,624 B1
(45) Date of Patent: Nov. 3, 2015

(54) MEMORY GENERATING METHOD OF MEMORY COMPILER AND GENERATED MEMORY

(71) Applicant: FARADAY TECHNOLOGY CORPORATION, Hsinchu (TW)

(72) Inventors: Hao Wu, Suzhou (CN); Song-Wen Yang, Suzhou (CN); Zhao-Yong Zhang, Suzhou (CN); Kun-Ti Lee, Kinmen County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/492,687

(22) Filed: Sep. 22, 2014

(30) Foreign Application Priority Data

May 8, 2014 (CN) .......................... 2014 1 0193882

(51) Int. Cl.
*G11C 16/04* (2006.01)
*G11C 8/08* (2006.01)
*G11C 5/14* (2006.01)

(52) U.S. Cl.
CPC ........ *G11C 8/08* (2013.01); *G11C 5/147* (2013.01); *G11C 5/145* (2013.01)

(58) Field of Classification Search
CPC ............ G11C 5/147; G11C 8/08; G11C 8/12; G11C 11/4087; G11C 8/10; G11C 11/404; G11C 13/0028; G11C 2029/1202; G11C 8/14
USPC ......................... 365/191, 149, 189.09, 230.06
See application file for complete search history.

(56) References Cited

U.S. PATENT DOCUMENTS

| | | | |
|---|---|---|---|
| 8,400,850 B2 * | 3/2013 | Takeda ..................... | G11C 7/02 365/154 |
| 8,493,812 B2 * | 7/2013 | Dengler ................. | G11C 5/145 365/154 |
| 2012/0106237 A1 | 5/2012 | Dengler et al. | |

* cited by examiner

*Primary Examiner* — David Lam
(74) *Attorney, Agent, or Firm* — Winston Hsu; Scott Margo

(57) ABSTRACT

A memory includes a logic controller, a word line driver, a boost circuit, plural capacitor circuits, plural memory cores, plural selectors, and plural output drivers. The logic controller generates a word line enabling signal and a boost enabling signal. The word line driver receives the word line enabling signal. The boost circuit receives the boost enabling signal. The plural capacitor circuits are connected between the boost circuit and the word line driver. Each of the plural memory cores is connected with the word line driver through plural word lines. The plural selectors are connected with the corresponding memory cores. The plural output drivers are connected with the corresponding selectors. The number of the plural memory cores is positively correlated with the number of the plural capacitor circuits.

17 Claims, 5 Drawing Sheets

MEMORY GENERATING METHOD OF MEMORY COMPILER AND GENERATED MEMORY

This application claims the benefit of People's Republic of China Patent Application No. 201410193882.8, filed May 8, 2014, the subject matter of which is incorporated herein by reference.

FIELD OF THE INVENTION

The present invention relates to a memory generated by a memory compiler, and more particularly to a memory generated by a memory compiler and a memory generating method for adaptively increasing the word line voltage.

BACKGROUND OF THE INVENTION

For accelerating designing various memories, a memory compiler has been widely used in the industry. By means of the memory compiler, the researchers can design various memories with different sizes and storage capacities according to different requirements and features. Since the designed memories can be quickly applied to the production line, the time period required to fabricate the memories will be shortened.

FIG. 1 schematically illustrates the architecture of a memory generated by a conventional memory compiler. As shown in FIG. 1, the memory 50 comprises a logic controller 20, a word line driver (WL driver) 10, plural memory cores 11~1m, plural selectors 21~2m, and plural output drivers 31~3m.

Generally, during the writing/reading process of the memory 50, the logic controller 20 may control all internal circuits of the memory 50. Moreover, the WL driver 10 can decode a specified word line according to a corresponding address data and activate the specified word line. The plural memory cores 11~1m comprises plural word lines and plural bit lines (not shown). The word lines are connected with the WL driver 10. The storage capacity of the memory 50 is defined by the plural memory cores 11~1m collaboratively.

Take the first word line WL1 as an example. The first word line WL1 is connected with the WL driver 10 and all of the memory cores 11~1m. When the first word line WL1 is activated, the memory cells of the memory cores 11~1m connected with the first word line WL1 are all activated. In other words, the higher storage capacity of the memory 50 indicates that the number of the memory cores 11~1m is larger and the word line is longer.

Moreover, the plural selectors 21~2m comprise respective multiplexers (not shown) and respective sense amplifiers (not shown) for selecting the corresponding bit lines and sensing the data of the corresponding bit lines. Moreover, the data of the corresponding bit lines are outputted from the output drivers 31~3m.

Generally, after the specified design parameters are inputted into the memory compiler, the memory 50 can be generated by the memory compiler according to the practical requirements.

For example, after a specified storage capacity is inputted into the memory compiler, the number of the memory cores 11~1m, the number of the selectors 21~2m and the number of the output drivers 31~3m are calculated by the memory compiler. The memory cores 11~1m, the selectors 21~2m, the output drivers 31~3m, the logic controller 20 and the WL driver 10 are combined as the memory 50. Generally, one memory core corresponds to one selector and one output driver. That is, the m memory cores 11~1m correspond to the m selectors 21~2m and the m output drivers 31~3m. After the above circuits are placed by the memory compiler, the memory 50 is produced.

With increasing development of the semiconductor manufacturing process, memories can be fabricated by the advanced manufacturing process. However, if the memory 50 is fabricated by the advanced manufacturing process under the 40 nm process, the yield rate of the memory 50 is impaired. It was found that the process variation may cause reduction of the induced current of the memory. Since the induced current is insufficient to allow normal operations of the memory, the yield rate of the memory is impaired. The memory cell that cannot be normally operated because of the process variation is usually referred as a weak memory cell.

Conventionally, a method of increasing a word line voltage is provided for allowing the normal operations of the weak memory cell. After the word line voltage is increased, the weak memory cell can be normally operated, and the yield rate of the memory can be effectively enhanced.

FIG. 2 is a schematic circuit diagram illustrating a conventional word line boost circuit. The word line boost circuit 308 is used for increasing the word line voltage.

As shown in FIG. 2, the word line boost circuit 308 comprises a regulator 306, plural switch transistors SW1, SW2, SW3, a boost capacitor C1, and a switch timing circuit 302. The switch timing circuit 302 receives a bank select signal. According to the bank select signal, the switch timing circuit 302 controls the switch transistors SW1, SW2 and SW3. When the word line is activated, the superposed voltage of a power supply voltage VDD and an adjustable voltage VDELTA is transmitted from the boost capacitor C1 to a word line driver (WL driver) 304 and then sent to the memory array.

The adjustable voltage VDELTA is determined by the regulator 306 according to a reference voltage VREF from a programmable voltage source 310. In other words, the magnitude of the voltage increased by the word line boost circuit 308 may be determined according to the reference voltage VREF from the programmable voltage source 310.

However, the regulator 306 of the word line boost circuit 308 and the programmable voltage source 310 consume a great amount of electric power and occupy very large layout areas.

Moreover, when the word line boost circuit 308 is applied to the memory compiler, some problems may occur. For example, if the number of the memory cores of the memory is different, the length of the word line is different. That is, if the storage capacity of the memory is changed, it is necessary to adjust the magnitude of the reference voltage VREF of the word line boost circuit 308. In other words, the conventional word line boost circuit is not user-friendly.

SUMMARY OF THE INVENTION

An embodiment of the present invention provides a memory. The memory includes a logic controller, a word line driver, a boost circuit, plural capacitor circuits, plural memory cores, plural selectors, and plural output drivers. The logic controller generates a word line enabling signal and a boost enabling signal. The word line driver receives the word line enabling signal. The boost circuit receives the boost enabling signal. The plural capacitor circuits are connected between the boost circuit and the word line driver. Each of the plural memory cores is connected with the word line driver through plural word lines. The plural selectors are connected with the corresponding memory cores. The plural output drivers are connected with the corresponding selectors. The number of the plural memory cores is positively correlated with the number of the plural capacitor circuits.

Another embodiment of the present invention provides a memory generating method of a memory compiler. Firstly, a memory information about a specified storage capacity of a memory is received. Then, the numbers of plural memory cores, plural selectors, plural output drivers and plural capacitor circuits are calculated according to the memory information. After the plural memory cores, the plural selectors, the plural output drivers, the plural capacitor circuit, a logic controller, a word line driver and a boost circuit are placed, the memory is generated. Moreover, the number of the plural memory cores is positively correlated with the number of the plural capacitor circuits.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3:
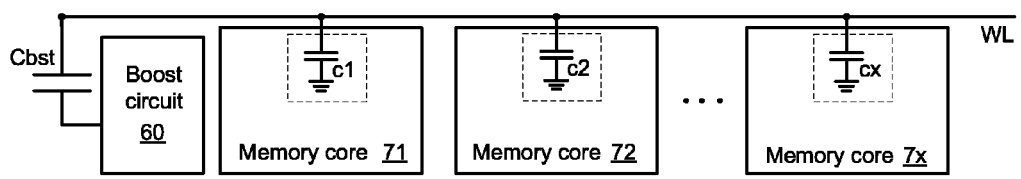
FIG. 3 is a schematic circuit diagram illustrating the relationship between the loading of a word line and a boost capacitor.

FIG. 3 is a schematic circuit diagram illustrating the relationship between the loading of a word line and a boost capacitor. For example, each word line WL is connected with x memory cores 71~7x. In addition, the word line WL is coupled to a boost circuit 60.

As shown in FIG. 3, the word line WL is connected with the x memory cores 71~7x. Moreover, the memory cores 71~7x have respective loadings c1~cx. Consequently, the loading on the word line WL may be expressed as: Cwl=(c1+ . . . +cx). The boost circuit 60 has a boost capacitor Cbst. When the word line WL is activated, a word line voltage Vwl provided by the boost circuit 60 may be expressed as the following formula:

$$Vwl = \left(1 + \frac{Cbst}{Cbst + Cwl}\right) \times VDD,$$

where VDD is a power supply voltage of the memory.

As the length of the word line WL increases, the loading Cwl on the word line WL increases. Consequently, the word line voltage Vwl provided by the boost circuit 60 is reduced.

The present invention provides a memory compiler for designing a desired memory according to design parameters. The memory comprises associated circuits for increasing the word line voltage. These circuits may change the value of the boost capacitor Cbst according to the change of the loading Cwl on the word line WL. In other words, the memory compiler of the present invention is capable of adaptively increasing the word line voltage Vwl. The operating principles of the memory compiler of the present invention will be illustrated in more details as follows.

Figure 4:
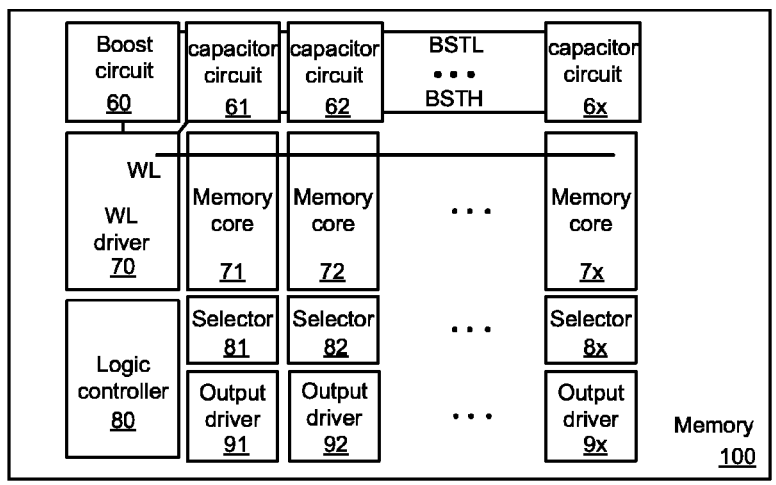
FIG. 4 schematically illustrates the architecture of a memory generated by a memory compiler according to an embodiment of the present invention.

FIG. 4 schematically illustrates the architecture of a memory generated by a memory compiler according to an embodiment of the present invention. After a memory information about a specified storage capacity is inputted into the memory compiler, a memory 100 is generated by the memory compiler. In other words, the number of the memory cores 71~7x, the number of selectors 81~8x and the number of output drivers 91~9x are calculated by the memory compiler according to the memory information about the specified storage capacity. The memory cores 71~7x, the selectors 81~8x, the output drivers 91~9x, a logic controller 80 and a word line driver (WL driver) 70 are combined as the memory 50. Moreover, the memory compiler further comprises a boost circuit 60 and plural capacitor circuits 61~6x. After the capacitor circuits 61~6x, the memory cores 71~7x, the selectors 81~8x, the output drivers 91~9x, the logic controller 80, the WL driver 70 and the boost circuit 60 are placed by the memory compiler, the memory 100 is produced.

Figure 1:
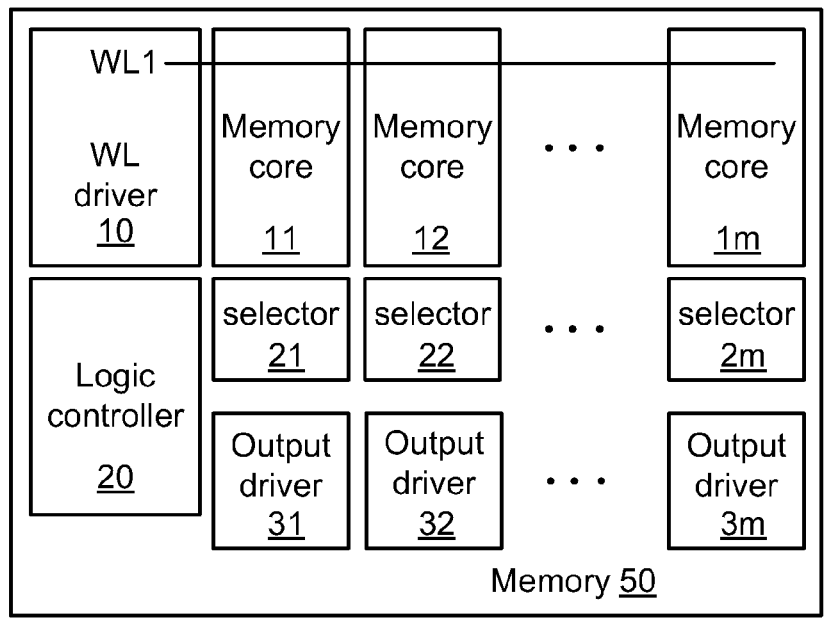
FIG. 1 (prior art) schematically illustrates the architecture of a memory generated by a conventional memory compiler.
Figure 2:
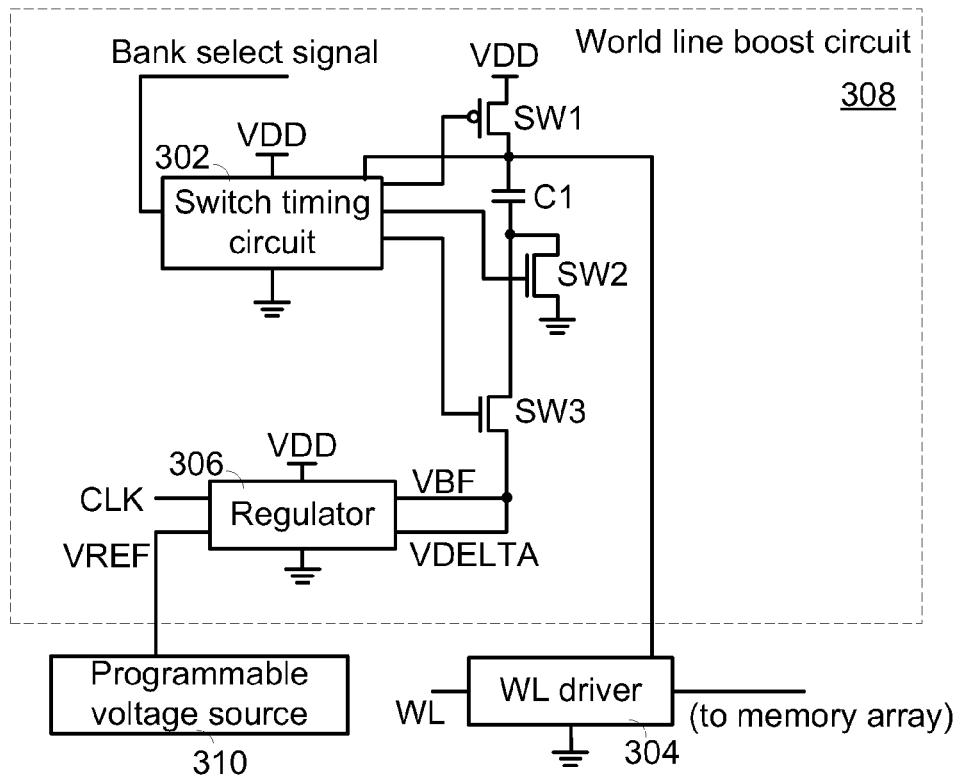
FIG. 2 (prior art) is a schematic circuit diagram illustrating a conventional word line boost circuit.

The functions of the logic controller 80, the WL driver 70, the memory cores 71~7x, the selectors 81~8x and the output drivers 91~9x of the memory 100 are similar to those of FIG. 1, and are not redundantly described herein.

In the memory 100 generated by the memory compiler, one memory core corresponds to one selector, one output driver and one capacitor circuit. That is, x memory cores correspond to x selectors 81~8x, x output drivers 91~9x and x capacitor circuits 61~6x. Moreover, the boost circuit 60 and the x capacitor circuits 61~6x of the memory 100 are used for generating a boosted word line voltage Vwl. That is, the number of the memory cores 71~7x is positively correlated with the number of the capacitor circuits 61~6x.

Please refer to FIG. 4 again. The WL driver 70 is coupled to the boost circuit 60. The WL driver 70 is connected with all of the capacitor circuits 61~6x through a first conductor line BSTH. The boost circuit 60 is connected with all of the capacitor circuits 61~6x through a second conductor line BSTL. Moreover, each of the capacitor circuits 61~6x comprises a capacitor (not shown). The capacitor is connected between the first conductor line BSTH and the second conductor line BSTL. The capacitance value of the boost capacitor Cbst of the boost circuit 60 is equal to the equivalent capacitance value on the first conductor line BSTH and the second conductor line BSTL.

Please refer to FIG. 4 again. As the number of the memory cores increases, the number of the capacitor circuits increases. Moreover, as the number of the memory cores increases, the length of the word line WL increases and thus the loading Owl on the word line WL increases. Moreover, as the number of the capacitor circuits increases, the equivalent capacitance value of the boost capacitor Cbst increases.

As mentioned above, the word line voltage Vwl provided by the boost circuit 60 may be expressed as the following formula:

$$Vwl = \left(1 + \frac{Cbst}{Cbst + Cwl}\right) \times VDD$$

Since the equivalent capacitance value of the boost capacitor Cbst increases with the increasing loading Owl on the word line WL, the word line voltage Vwl provided by the boost circuit 60 can be maintained at a proper level.

Figure 5A:
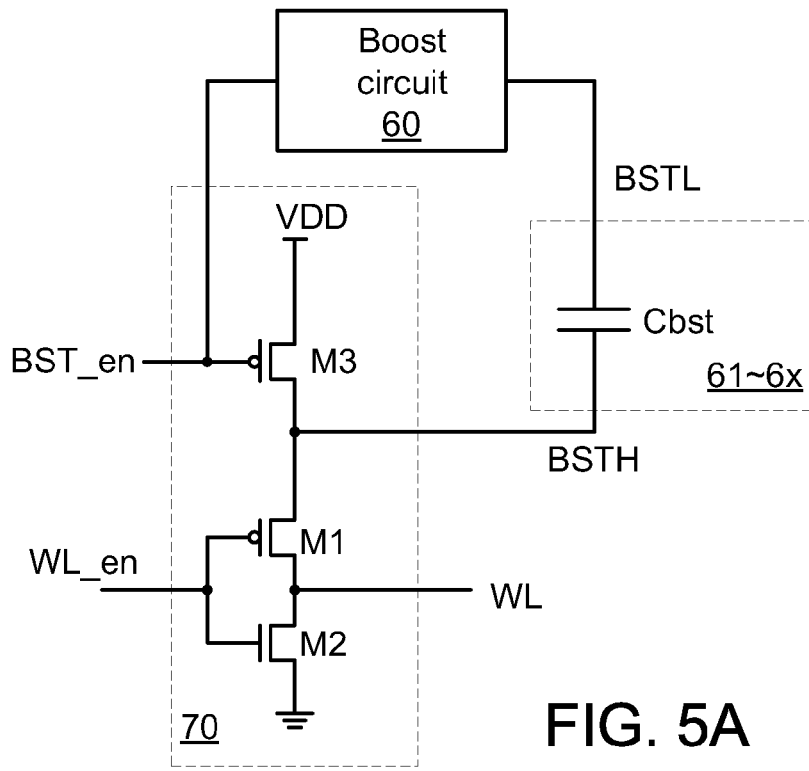
FIG. 5A is a schematic circuit diagram illustrating the relationship between the WL driver, the boost circuit and the capacitor circuits of the memory according to a first embodiment of the present invention.
Figure 5B:
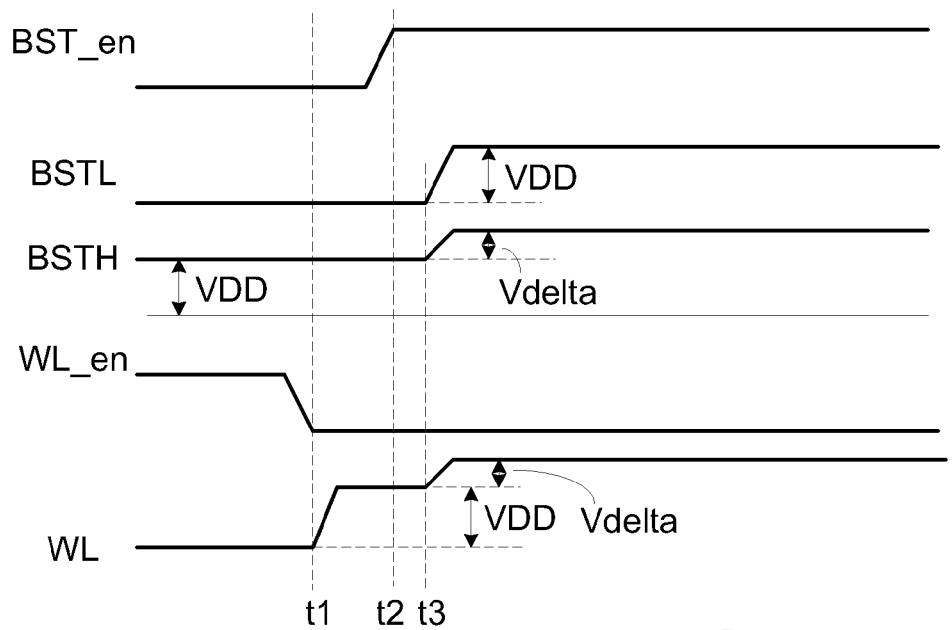
FIG. 5B is a schematic timing waveform diagram illustrating associated signals of FIG. 5A.

FIG. 5A is a schematic circuit diagram illustrating the relationship between the WL driver, the boost circuit and the capacitor circuits of the memory according to a first embodiment of the present invention. FIG. 5B is a schematic timing waveform diagram illustrating associated signals of FIG. 5A.

As shown in FIG. 5A, the WL driver 70 comprises a first transistor M1, a second transistor M2 and a third transistor M3. The source terminal of the third transistor M3 is connected with the power supply voltage VDD. The gate terminal of the third transistor M3 receives a boost enabling signal BST_en. The drain terminal of the third transistor M3 is connected with the first conductor line BSTH. The source terminal of the first transistor M1 is connected with the first conductor line BSTH. The gate terminal of the first transistor M1 receives a word line enabling signal WL_en. The drain terminal of the first transistor M1 is connected with the word line WL. The drain terminal of the second transistor M2 is connected with the word line WL. The gate terminal of the second transistor M2 receives the word line enabling signal WL_en. The source terminal of the second transistor M2 is connected with a ground terminal.

The boost circuit 60 receives the boost enabling signal BST_en. Moreover, the boost circuit 60 is connected with the second conductor line BSTL. The capacitor circuits 61~6x are connected between the first conductor line BSTH and the second conductor line BSTL. The equivalent capacitance value of the capacitor circuits 61~6x is considered as the capacitance value of the boost capacitor Cbst.

In this embodiment, the boost enabling signal BST_en and the word line enabling signal WL_en are outputted from the logic controller 80. Please refer to FIG. 5B. At the time point t1, the word line enabling signal WL_en is activated, and the first transistor M1 and the third transistor M3 are turned on. Consequently, the voltage of the word line WL is gradually increased to the power supply voltage VDD.

At the time point t2, the boost enabling signal BST_en is activated, and the third transistor M3 is turned off. Consequently, at the time point t3, the voltage of the word line WL is gradually increased to the sum of the power supply voltage VDD and an increment voltage Vdelta. That is, the voltage of the word line WL is equal to the voltage of the first conductor line BSTH. Consequently, after the boost enabling signal BST_en is activated, the word line voltage is effectively increased.

Figure 6A:
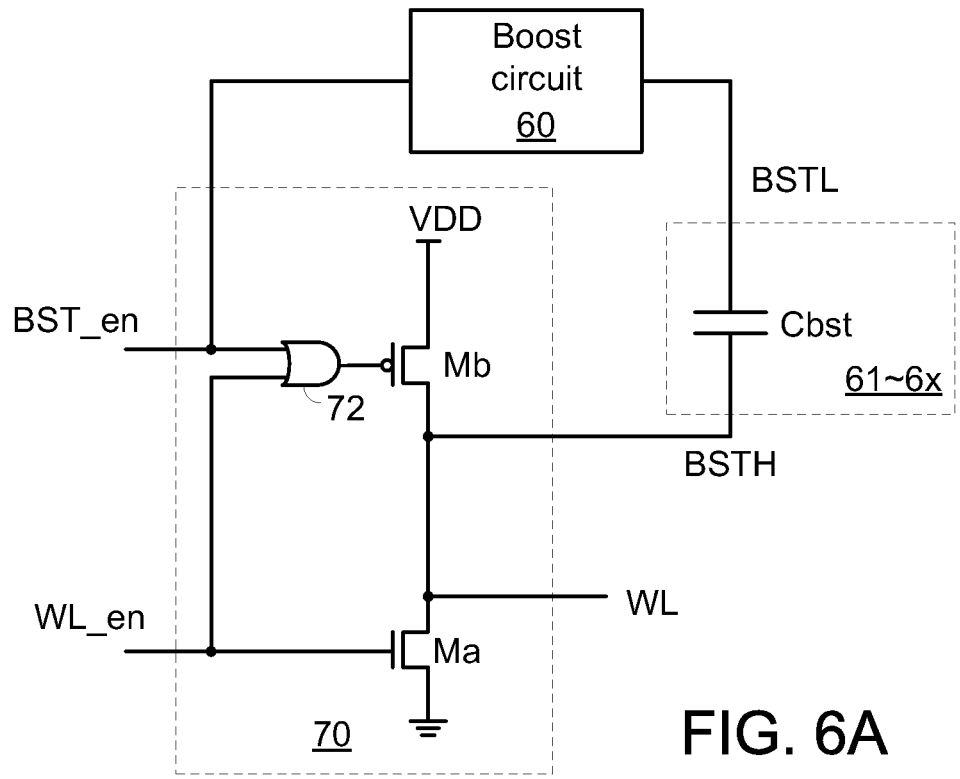
FIG. 6A is a schematic circuit diagram illustrating the relationship between the WL driver, the boost circuit and the capacitor circuits of the memory according to a second embodiment of the present invention.
Figure 6B:
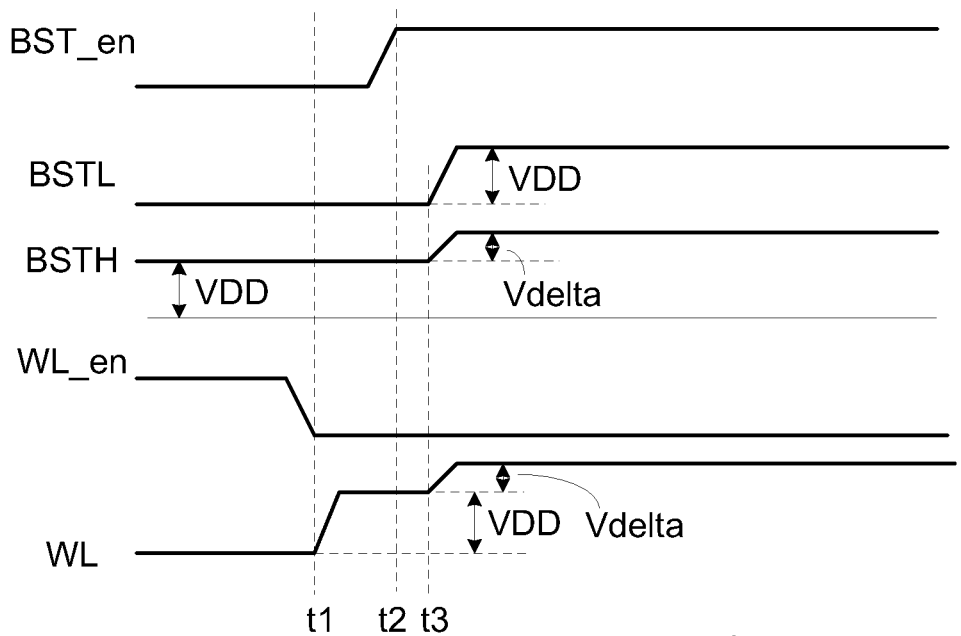
FIG. 6B is a schematic timing waveform diagram illustrating associated signals of FIG. 6A.

FIG. 6A is a schematic circuit diagram illustrating the relationship between the WL driver, the boost circuit and the capacitor circuits of the memory according to a second embodiment of the present invention. FIG. 6B is a schematic timing waveform diagram illustrating associated signals of FIG. 6A.

As shown in FIG. 6A, the WL driver 70 comprises an OR gate 72, a transistor Ma and a transistor Mb. Two input terminals of the OR gate 72 receives the boost enabling signal BST_en and the word line enabling signal WL_en, respectively. The source terminal of the transistor Mb is connected with the power supply voltage VDD. The gate terminal of the transistor Mb is connected with an output terminal of the OR gate 72. The drain terminal of the transistor Mb is connected with the first conductor line BSTH and the word line WL. The drain terminal of the transistor Ma is connected with the first conductor line BSTH. The gate terminal of the transistor Ma receives the word line enabling signal WL_en. The source terminal of the transistor Ma is connected with the ground terminal.

The boost circuit 60 receives the boost enabling signal BST_en. Moreover, the boost circuit 60 is connected with the second conductor line BSTL. The capacitor circuits 61~6x are connected between the first conductor line BSTH and the second conductor line BSTL. The equivalent capacitance value of the capacitor circuits 61~6x is considered as the capacitance value of the boost capacitor Cbst.

In this embodiment, the boost enabling signal BST_en and the word line enabling signal WL_en are outputted from the logic controller 80. Please refer to FIG. 6B. At the time point t1, the boost enabling signal BST_en is in the low-level state, and the word line enabling signal WL_en is switched to the low-level state. Under this circumstance, the transistor Mb is turned on, and the transistor Ma is turned off. Consequently, the voltage of the word line WL is gradually increased to the power supply voltage VDD.

At the time point t2, the boost enabling signal BST_en is switched to the high-level state. Under this circumstance, the transistor Mb is turned off, and the transistor Ma is turned off. Consequently, at the time point t3, the voltage of the word line WL is gradually increased to the sum of the power supply voltage VDD and an increment voltage Vdelta. That is, the voltage of the word line WL is equal to the voltage of the first conductor line BSTH. Consequently, after the boost enabling signal BST_en is activated, the word line voltage is effectively increased.

Figure 7A:
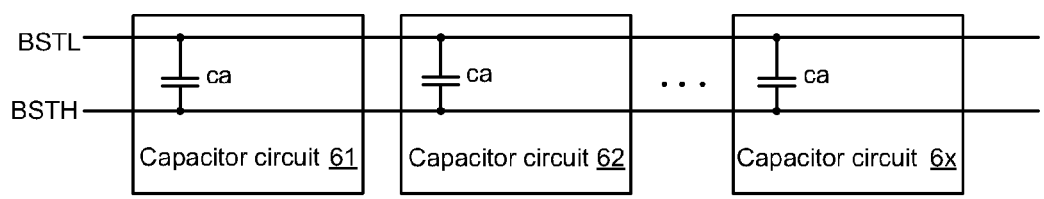
FIGS. 7A and 7B are schematic circuit diagrams illustrating two examples of the capacitor circuit in the memory of the present invention.
Figure 7B:
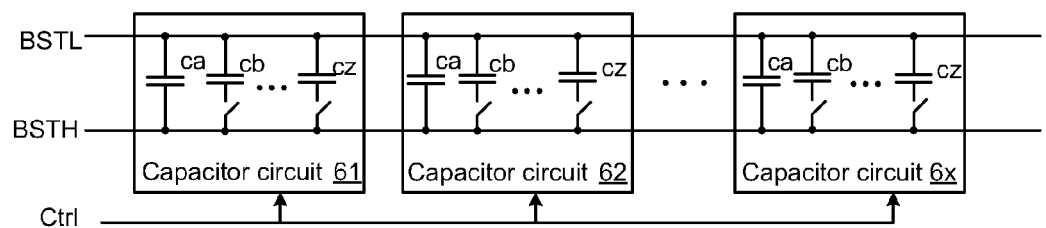

FIGS. 7A and 7B are schematic circuit diagrams illustrating two examples of the capacitor circuit in the memory of the present invention.

As shown in FIG. 7A, each of the capacitor circuits 61~6x comprises a capacitor ca, which is connected between the first conductor line BSTH and the second conductor line BSTL. Since the memory comprises the x capacitor circuits 61~6x, the equivalent capacitance value of the boost capacitor Cbst is equal to the sum of the capacitance values of the x capacitors ca.

As shown in FIG. 7B, each of the capacitor circuits 61~6x comprises at least one capacitor ca, which is connected between the first conductor line BSTH and the second conductor line BSTL. The other capacitors cb~cz of each of the capacitor circuits 61~6x are selectively connected between the first conductor line BSTH and the second conductor line BSTL according to a control signal Ctrl from the logic controller 80. In other word, the equivalent capacitance value of the boost capacitor Cbst can be fine-tuned according to the control signal Ctrl. Consequently, the word line voltage Vwl is adjusted more precisely.

From the above descriptions, the present invention provides a memory compiler for designing a desired memory according to design parameters. Moreover, the memory compiler may change the value of the boost capacitor according to the change of the loading on the word line. In other words, the memory compiler of the present invention is capable of adaptively increasing the word line voltage.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory, comprising:
   a logic controller generating a word line enabling signal and a boost enabling signal;
   a word line driver receiving the word line enabling signal;
   a boost circuit receiving the boost enabling signal;
   plural capacitor circuits connected between the boost circuit and the word line driver;
   plural memory cores, wherein each of the plural memory cores is connected with the word line driver through plural word lines;
   plural selectors connected with the corresponding memory cores; and
   plural output drivers connected with the corresponding selectors,
   wherein the number of the plural memory cores is positively correlated with the number of the plural capacitor circuits.

2. The memory as claimed in claim 1, wherein the word line driver has a first conductor line, the boost circuit has a second conductor line, and the plural capacitor circuits are connected between the first conductor line and the second conductor line.

3. The memory as claimed in claim 2, wherein the word line driver comprises:
   a first transistor, wherein a gate terminal of the first transistor receives the word line enabling signal, a source terminal of the first transistor is connected with the first conductor line, and a drain terminal of the first transistor is connected with one of the plural word lines;
   a second transistor, wherein a gate terminal of the second transistor receives the word line enabling signal, a source terminal of the second transistor is connected with a ground terminal, and a drain terminal of the second transistor is connected with the drain terminal of the first terminal; and
   a third transistor, wherein a gate terminal of the third transistor receives the boost enabling signal, a source terminal of the third transistor is connected with a power supply voltage, and a drain terminal of the third transistor is connected with the first conductor line.

4. The memory as claimed in claim 3, wherein the boost circuit is connected between the gate terminal of the third transistor and the second conductor line.

5. The memory as claimed in claim 2, wherein each of the plural capacitor circuits comprises a capacitor, wherein the capacitor is connected between the first conductor line and the second conductor line.

6. The memory as claimed in claim 2, wherein each of the plural capacitor circuits comprises:
   a first capacitor connected between the first conductor line and the second conductor line; and
   a second capacitor selectively connected between the first conductor line and the second conductor line according to a control signal from the logic controller.

7. The memory as claimed in claim 2, wherein the word line driver comprises:
   an OR gate comprising a first input terminal, a second input terminal and an output terminal, wherein the first input terminal of the OR gate receives the word line enabling signal, and the second input terminal of the OR gate receives the boost enabling signal;
   a first transistor, wherein a gate terminal of the first transistor receives the word line enabling signal, a source terminal of the first transistor is connected with a ground terminal, and a drain terminal of the first transistor is connected with one of the plural word lines; and
   a second transistor, wherein a gate terminal of the second transistor is connected with the output terminal of the OR gate, a source terminal of the second transistor is connected with a power supply voltage, and a drain terminal of the second transistor is connected with the first conductor line and the drain terminal of the first transistor.

8. The memory as claimed in claim 7, wherein the boost circuit is connected between the second input terminal of the OR gate and the second conductor line.

9. A memory generating method of a memory compiler, the memory generating method comprising steps of:
   receiving a memory information about a specified storage capacity of a memory;
   calculating the numbers of plural memory cores, plural selectors, plural output drivers and plural capacitor circuits according to the memory information; and
   placing the plural memory cores, the plural selectors, the plural output drivers, the plural capacitor circuits, a logic controller, a word line driver and a boost circuit, so that the memory is generated,
   wherein the number of the plural memory cores is positively correlated with the number of the plural capacitor circuits.

10. The memory generating method as claimed in claim 9, wherein the logic controller generates a word line enabling signal and a boost enabling signal, the word line driver receives the word line enabling signal, the boost circuit receives the boost enabling signal, the plural capacitor circuits are connected between the boost circuit and the word line driver, each of the plural memory cores is connected with the word line driver through plural word lines, the plural selectors are connected with the corresponding memory cores, and the plural output drivers are connected with the corresponding selectors.

11. The memory generating method as claimed in claim 10, wherein the word line driver has a first conductor line, the boost circuit has a second conductor line, and the plural capacitor circuits are connected between the first conductor line and the second conductor line.

12. The memory generating method as claimed in claim 11, wherein the word line driver comprises:
   a first transistor, wherein a gate terminal of the first transistor receives the word line enabling signal, a source terminal of the first transistor is connected with the first conductor line, and a drain terminal of the first transistor is connected with one of the plural word lines;
   a second transistor, wherein a gate terminal of the second transistor receives the word line enabling signal, a source terminal of the second transistor is connected with a ground terminal, and a drain terminal of the second transistor is connected with the drain terminal of the first terminal; and a third transistor, wherein a gate terminal of the third transistor receives the boost enabling signal, a source terminal of the third transistor is connected with a power supply voltage, and a drain terminal of the third transistor is connected with the first conductor line.

13. The memory generating method as claimed in claim 12, wherein the boost circuit is connected between the gate terminal of the third transistor and the second conductor line.

14. The memory generating method as claimed in claim 11, wherein each of the plural capacitor circuits comprises a capacitor, wherein the capacitor is connected between the first conductor line and the second conductor line.

15. The memory generating method as claimed in claim 11, wherein each of the plural capacitor circuits comprises:

a first capacitor connected between the first conductor line and the second conductor line; and a second capacitor selectively connected between the first conductor line and the second conductor line according to a control signal from the logic controller.

16. The memory generating method as claimed in claim 11, wherein the word line driver comprises:

an OR gate comprising a first input terminal, a second input terminal and an output terminal, wherein the first input terminal of the OR gate receives the word line enabling signal, and the second input terminal of the OR gate receives the boost enabling signal;

a first transistor, wherein a gate terminal of the first transistor receives the word line enabling signal, a source terminal of the first transistor is connected with a ground terminal, and a drain terminal of the first transistor is connected with one of the plural word lines; and a second transistor, wherein a gate terminal of the second transistor is connected with the output terminal of the OR gate, a source terminal of the second transistor is connected with a power supply voltage, and a drain terminal of the second transistor is connected with the first conductor line and the drain terminal of the first transistor.

17. The memory generating method as claimed in claim 16, wherein the boost circuit is connected between the second input terminal of the OR gate and the second conductor line.

\* \* \* \* \*